United States Patent
Fujino et al.

(10) Patent No.: US 7,651,928 B2
(45) Date of Patent: Jan. 26, 2010

(54) METHOD FOR CRYSTALLIZING A SEMICONDUCTOR THIN FILM

(75) Inventors: Toshio Fujino, Kanagawa (JP); Akio Machida, Kanagawa (JP); Tadahiro Kono, Tokyo (JP)

(73) Assignee: Sony Corporation, Tokyo (JP)

( * ) Notice: Subject to any disclaimer, the term of this patent is extended or adjusted under 35 U.S.C. 154(b) by 107 days.

(21) Appl. No.: 11/683,106

(22) Filed: Mar. 7, 2007

(65) Prior Publication Data
US 2007/0212858 A1    Sep. 13, 2007

(30) Foreign Application Priority Data
Mar. 13, 2006   (JP)   ............... 2006-067271
Dec. 21, 2006   (JP)   ............... 2006-344130

(51) Int. Cl.
*H01L 21/20* (2006.01)
*H01L 21/36* (2006.01)
(52) U.S. Cl. ............... 438/486; 267/E21.461
(58) Field of Classification Search ......... 438/486; 257/E21.461
See application file for complete search history.

(56) References Cited

U.S. PATENT DOCUMENTS
7,235,811 B2 *   6/2007   Crowder et al. ............ 257/64
7,410,878 B2 *   8/2008   Chao et al. ............... 438/368

FOREIGN PATENT DOCUMENTS

| JP | 58-039012 | 3/1983 |
| JP | 58-162032 | 9/1983 |
| JP | 61-179524 | 8/1986 |
| JP | 2003-077834 | 3/2003 |
| JP | 2005-005323 | 1/2005 |
| JP | 2005-322842 | 11/2005 |

OTHER PUBLICATIONS

Matsumura M., "Preparation of Ultra-Large Grain Silicon Thin-Films by Excimer-Laser," Surface Science, vol. 21, pp. 278-287, 2000.
Japanese Office Action issued on Mar. 24, 2009, for corresponding Japanese Patent Application JP 2006-344130. Japanese only, no translation.

* cited by examiner

*Primary Examiner*—David S Blum
(74) *Attorney, Agent, or Firm*—K&L Gates LLP

(57) ABSTRACT

A method for crystallizing a semiconductor thin film is provided. The method includes continuously irradiating an energy beam on a semiconductor thin film while scanning at a given speed. The energy beam is scanned in parallel lines while keeping pitches of not larger than an irradiation radius of the energy beam to grow band-shaped crystal grains in a direction different from a scanning direction of the energy beam.

7 Claims, 5 Drawing Sheets

METHOD FOR CRYSTALLIZING A SEMICONDUCTOR THIN FILM

CROSS REFERENCES TO RELATED APPLICATIONS

The present application claims priority to Japanese Patent Application JP 2006-067271 filed in the Japan Patent Office on Mar. 13, 2006; and JP 2006-344130 filed in the Japan Patent Office on Dec. 21, 2006, the entire contents of which are being incorporated herein by reference.

BACKGROUND

The present disclosure relates to a method for crystallizing a semiconductor thin film by irradiation of an energy beam.

In flat displays such as liquid crystal displays and organic EL displays using organic electroluminescent elements, thin film transistors (TFT) are used as a switching element for the active matrix display of a plurality of pixels. The thin film transistor includes TFT using polysilicon (poly-Si) as an active region (polysilicon TFT) and TFT using amorphous silicon (amorphous Si) as an active region (amorphous silicon TFT).

Of these, the polysilicon TFT has the feature that it is about 10 times to 100 times greater than the amorphous silicon TFT with respect to the carrier mobility, with reduced degradation of on current. In this sense, the polysilicon TFT not only has very excellent characteristics for use as a switching element of such displays as mentioned above, but also has attracted attention for use as switching elements constituting various types of logic circuits (e.g. domino logic circuits, CMOS transmission gate circuits and the like) and multiplexers, EPROM, EEPROM, CCD and RAM using the logic circuits).

For a manufacturing technique of such a polysilicon TFT, there has been developed a so-called low temperature polysilicon process using a low temperature process of approximately 600° C. or below, thereby realizing low costs of a substrate. In the low temperature polysilicon process, a pulse laser crystallization technique has been in wide use wherein an amorphous silicon film is crystallized by use of a pulse laser whose oscillation time is very short. The pulse laser crystallization technique is a technique wherein a silicon thin film on a substrate is irradiated with a high-output pulse laser beam to instantaneously melt the film and such a property of silicon being crystallized during the course of solidification is utilized.

For instance, in the low temperature polysilicon process using an excimer laser, a line-shaped laser beam is shifted little by little for pulse irradiation on an amorphous silicon film while overlapping irradiation on most of portions of the film, under which 10 to 20 cycles of laser beam irradiation on the same portion are repeated. The polycrystal whose crystal size is uniform may be obtained on the entire surface of active region by this process. Moreover, a method of controlling the position of crystal grains using crystallization according to an SLS (sequential lateral solidification) procedure has been proposed. In addition, there has also been proposed, for example, a method of controlling the position of crystal grains by spacially modulating a phase of an excimer laser beam through a phase shift mask to have the irradiating laser beam had an energy density gradient (see "Surface Science 21", 2000, vol. 21, No. 5 pp. 278-287).

Aside from those methods using a line-shaped laser beam as set out above, there has been proposed a method for arranging relatively small-sized crystals by explosive crystallization with use of a spot beam laser such as of Ar gas.

In recent years, in such flat panel displays as set forth above, a high frame-rate liquid crystal display is being developed for the purpose of further improving a moving image characteristic and a contact characteristic. New types of displays such as a self-emitting display such as an organic EL display are now under development. This entails the demand for development of TFT for use as a switching element applicable to these displays, which undergoes little characteristic degradation upon abrupt passage of a great current and is small in characteristic variation among switching elements.

In this connection, although the polysilicon TFT obtained by the prior-art low temperature polysilicon process is very advantageous in that it has the likelihood of passing a relative great current, has a great carrier mobility and is small in characteristic degradation, variations in element-to-element characteristics, especially, an initial threshold voltage and an on current, are greater than those of the amorphous silicon TFT. The characteristic variation among the polysilicon TFT elements is a factor of causing uneven brightness in the display using the polysilicon TFT as a switching element.

The element-to-element variation in characteristics of the polysilicon TFT depends on the variation in number of grain boundaries existing in a channel portion of the polysilicon TFT in a channel direction (i.e. a direction along which electrons flow). Accordingly, within a range where the number of crystal boundaries is small, a slight difference in number of grain boundaries brings about a great variation of TFT elements. On the other hand, as the number of grain boundaries increases, a variation of TFT elements is suppressed low even if the number of grain boundaries in the channel portion differs more or less. In order to suppress the characteristic variation in the polysilicon TFTs to a low level, importance is placed on the formation of a polysilicon film wherein uniformly shaped, relatively small-sized crystals are regularly aligned.

However, an excimer laser widely employed in the pulse laser crystallization technique is a kind of gas laser, for which interpulse energy stability is low. Although polycrystals whose crystal size is uniform can be obtained by 10 to 20 cycles of laser beam irradiation on the same portion as stated hereinabove, the uniformity of the resulting crystal size is unsatisfactory. Additionally, the excimer laser is high in unit cost along with high running costs necessary for change of a laser tube (oscillator). The necessity of repetition of irradiation by about several tens of cycles lowers throughput, with the attendant problem that manufacturing costs of a product cannot be lowered.

The problem on the uniformity of crystal size being unsatisfactory is likewise experienced in such a method using a phase shift mask as discussed in "Surface Science 21", 2000, vol. 21, No. 5 pp. 278-287. This method has additional problems such as of high fabrication costs of the phase shift mask and a difficulty in making a large-sized substrate.

An explosive crystallization method using a spot beam laser such as of Ar gas is a recrystallization method using solid phase transition, for which the resulting crystals are poor in quality and it is difficult to obtain a satisfactory carrier mobility.

It is desirable to provide a method for crystallizing a semiconductor thin film wherein crystal grains having a good shape accuracy are regularly aligned, thereby enabling a crystal region of good accuracy exhibiting a high carrier mobility to be formed.

SUMMARY

One present embodiment provides a method for crystallizing a semiconductor thin film by continuously irradiating an energy beam on a semiconductor thin film while scanning at a given speed. The energy beam is scanned in parallel lines while keeping pitches not larger than an irradiation diameter of the energy beam thereby growing band-shaped crystal grains in a direction different from a scanning direction of the energy beam.

According to this method of crystallizing a semiconductor thin film, crystal growth of crystal grains at an adjacent scanning position proceeds inherently to take over the crystallinity of the crystal grains formed by a previous scanning cycle of the energy beam, and band-shaped crystal grains are formed in a direction different from the scanning direction of the energy beam. The width of the band-shaped crystal grains is well controlled depending on the scanning speed and irradiation conditions such as an irradiation energy of the energy beam.

As stated above, according to the method for crystallizing a semiconductor film, band-shaped crystal grains of a good shape accuracy are regularly aligned, thereby enabling a polycrystalline region whose high carrier mobility is controlled in high accuracy to be formed in the semiconductor thin film. Accordingly, the use of the thus obtained polycrystalline region can lead to a thin film transistor adaptable for use as a pixel switching element whose characteristic variation is effectively suppressed.

Additional features and advantages are described herein, and will be apparent from, the following Detailed Description and the figures.

DETAILED DESCRIPTION

Embodiments are described in more detail below with reference to the accompanying drawings. A method for crystallizing a semiconductor thin film and a method for manufacturing a thin film semiconductor device using the crystallization method are described in this order.

<Method for Crystallizing a Semiconductor Thin Film>

Figure 1A:
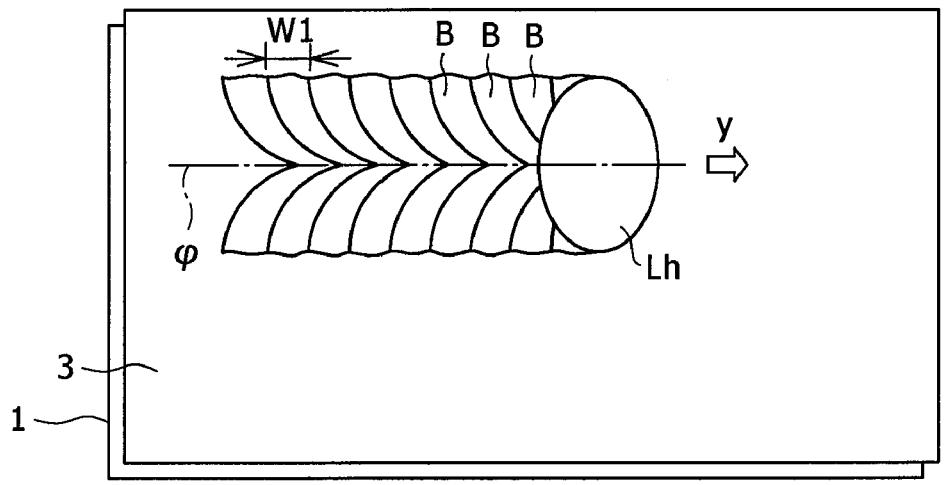
FIGS. 1A to 1C are, respectively, a plan view illustrating a crystallization method according to an embodiment.

Initially, as shown in FIG. 1A, a substrate 1 for forming a thin film semiconductor device is provided. The substrate 1 includes, aside form a silicon substrate, glass substrates such as an amorphous substrate, low melting substrates such as plastic substrates, quartz and sapphire substrates, substrates of metals such as aluminium and a stainless steel. It will be noted that the substrate 1 may be formed on one main surface thereof with an insulating film such as an oxide film and a nitride film as a buffer layer for preventing thermal conduction to the substrate 1 and that various types of metal films may also be formed.

Next, an amorphous semiconductor thin film 3 is formed on the substrate 1. The semiconductor thin film 3 made of amorphous silicon is formed herein, for example, by a PE-CVD (plasma-enhancement-chemical vapor deposition) method. The resulting semiconductor thin film 3 including so-called hydrogenated amorphous silicon (a-Si:H) containing a large quantity of hydrogen. The thickness of the semiconductor thin film 3 is, for example, at 20 nm to 100 nm.

It is to be noted that in so far as the film-forming temperature is suppressed low, the formation of the semiconductor thin film 3 is not limited to the above-mentioned PE-CVD method, but a coating method may also be used. In the latter case, a mixture of a polysilane compound with a solvent is coated onto and formed on the substrate 1, followed by drying and annealing to form the semiconductor thin film 3. According to the film-forming methods, in which the film-forming temperature is suppressed low, such as the above-mentioned PE-CVD method and the coating method mentioned above, there can be obtained the semiconductor thin film 3 made of hydrogenated amorphous silicon (a-Si:H) containing about 0.5 atomic % to 15 atomic %, which varies, more or less, depending on the film-forming conditions in either case.

Thereafter, if necessary, a so-called dehydrogenation annealing treatment is carried out so that an excess hydrogen ion is desorbed from the semiconductor thin film. For such a dehydrogenation annealing treatment, furnace annealing, for example, at 400° C. to 600° C. is carried out. If a subsequent annealing treatment for crystallization is conducted while controlling an irradiation energy so as to eliminate excess hydrogen from a portion irradiated with a laser beam without expansion by gasification of hydrogen ions in the semiconductor thin film 3, the dehydrogenation annealing treatment may be omitted.

Subsequently, a laser beam Lh is irradiated, as an energy beam, on an active region set on the semiconductor thin film 3.

The laser beam Lh includes, a Ga—N laser (wavelength: 405 nm), a Kr laser (wavelength: 413 nm), an Ar laser (wavelengths: 488 nm, 514.5 nm), and a second harmonic (532 nm) or a third harmonic (355 nm) of a Nd:YAG laser (wavelength: 1.06 μm), a second harmonic (524 nm) or a third harmonic (349 nm) of a Nd:YLF laser (wavelength: 1.05 μm), and a second harmonic (515 nm) or a third harmonic (344 nm) of a Yb:YAG laser (wavelength: 1.03 μm). Besides, a fundamental wave (792 nm) or a second harmonic (396 nm) of a Ti:sapphire laser may be used.

The laser beam Lh is irradiated herein on the semiconductor thin film 3 while scanning at a given speed in one scanning direction y. Especially, it is preferred to set the irradiation conditions of the laser beam Lh in conformity with the thickness of the semiconductor thin film so that the semiconductor thin film 3 is completely melted along the depth thereof by irradiation of the laser beam Lh.

To this end, the wavelength of the laser beam Lh irradiated on the semiconductor thin film 3 is so selected as to provide a relatively small coefficient of absorption sufficient to enable the beam to be absorbed in an entire area along the depth thereof based on the thickness of the semiconductor thin film 3 and the coefficient of absorption of the film without absorption only in the surface layer of the semiconductor thin film 3. More particularly, if the semiconductor thin film 3 is made of 50 m thick amorphous silicon, for instance, a laser beam having a wavelength of 350 nm to 470 nm is preferably used. For an oscillation source of a laser beam Lh having such a wavelength as indicted above, mention is made, for example, of a GaN compound semiconductor laser oscillator or a YAG laser oscillator.

Irradiation conditions other than the wavelength of the laser beam Lh set out above, e.g. a numerical aperture NA of an objective lens through which the laser beam Lh is irradiated, a scanning speed of the laser beam Lh, an irradiation energy and the like, may be controlled, thereby enabling the semiconductor thin film to be completely melted along the depth and crystallized. The irradiation of the laser beam Lh with a predetermined intensity or over on the amorphous semiconductor leads to complete melting of the semiconductor thin film 3.

In the crystallization step, the laser beam Lh whose wavelength has been so selected as mentioned above is preferably used as a spot beam whose beam profile is in a Gaussian form.

According to the scanning with the laser beam Lh as set out above, as the laser beam Lh passes, solidification proceeds in a scanning path where the semiconductor thin film 3 has been completely melted, and crystal grains B are aligned along a scanning center $\phi$ of the laser beam Lh. At this stage, when the beam profile of the laser beam Lh is made in a Gaussian form, the temperature of a portion irradiated with the laser beam Lh corresponds to the Gaussian form of the beam profile of the laser beam Lh and thus, becomes highest at the scanning center $\phi$ of the laser beam Lh and lowest at opposite ends. When the laser beam Lh is irradiated while scanning in the scanning direction y, crystallization and solidification commence from positions, which are most distant from the scanning center $\phi$ in a scanning path where the semiconductor thin film 3 has been completely melted (i.e. opposite side ends of the scanning path of the laser beam). Eventually, a given number of crystal species occur at the opposite side ends of the scanning path. As the scanning with the laser beam Lh further proceeds, solidification is advanced in the scanning direction y towards the scanning center $\phi$ and proceeds in a state where the crystal species B are pulled toward the scanning direction y and also toward the scanning center $\phi$, and crystallization finally occurs at the scanning center $\phi$. The scanning speed and output of the laser beam Lh may be appropriately controlled within the range of such irradiation conditions as set out above so as to permit solidification to be completed at the scanning center $\phi$. In this way, there are obtained crystal grains B in a semi-crescent form broadened from the scanning center $\phi$ toward opposite sides of the scanning path, or in the form of a crescent that is axisymmetrically divided into halves.

In this case, depending on the irradiation conditions of the laser beam Lh, a width W1 of the crystal grain B is controlled in the scanning direction y of the laser beam Lh. Accordingly, it is important to set the irradiation conditions of the laser beam Lh, i.e. the wavelength of the laser beam Lh, the numeral aperture (NA) of an objective lens through which the laser beam is irradiated, the scanning speed and irradiation energy of the laser beam Lh, and the like, within ranges where the semiconductor thin film 3 is completely melted along the depth thereof by irradiation of the laser beam Lh and also to set a width W1 of the crystal grain B at a given value.

Figure 1B:
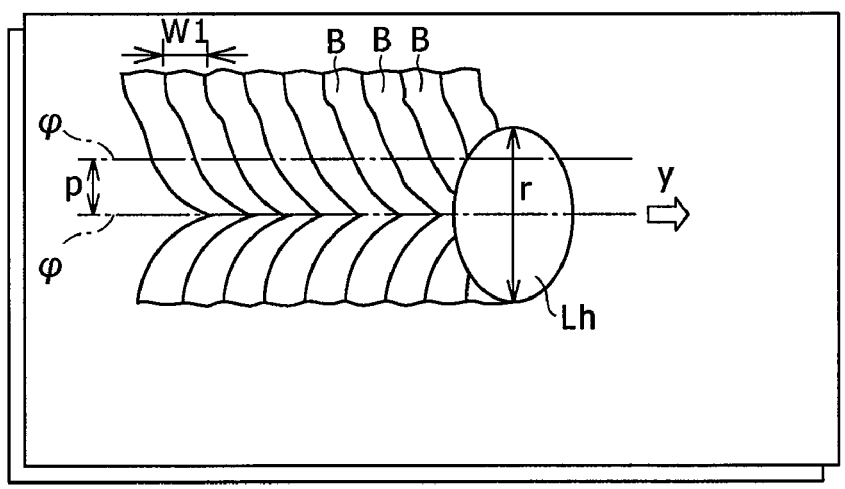

Next, as shown in FIG. 1B, a second scanning of the laser beam Lh is carried out wherein the scanning path is shifted by a given pitch p relative to the scanning path of the previously irradiated laser beam Lh. The scanning direction y should be a direction parallel to the first scanning. The pitch p (a shifted width of the scanning path) of the laser beam scanned in parallel lines should be not larger than a diameter (an irradiation diameter in a direction vertical to the scanning direction y) r of the laser beam Lh. This enables solidification with the scanning of the second laser beam Lh to proceed inherently to take over the crystallinity of the crystal grains B formed at the scanning position of the adjacent laser beam Lh, thereby permitting crystal grains B to be grown in a direction different from the scanning direction y of the laser beam Lh.

In an embodiment, the pitch p of the laser beam Lh scanned in parallel lines is not larger than an irradiation radius (r/2) of the laser beam Lh. This makes it easy to control the growth of the crystal grains B in a given direction. As stated before, where a laser beam Lh of a Gaussian form is scanned, solidification proceeds in the scanning direction y from the opposite ends of the scanning path toward the scanning center $\phi$, so that there are formed crystal grains B that are in line-symmetric relative to the scanning center $\phi$. Hence, when the pitch p of the laser beams Lh is made not larger than the irradiation radius (r/2) of the laser beam Lh, crystallization proceeds so as to leave only a portion of the crystal grains B where solidification is advanced in the scanning direction y from one end side of the scanning path toward the scanning center $\phi$. For this, the control of the growth of the crystal grains B in a given direction becomes easy. For instance, where crystal grains B having a width W1 of several hundreds of nanometers are grown while keeping the width W1, a laser beam Lh in the form of a spot having an irradiation diameter of 200 nm to 500 nm is scanned while shifting the scanning path by a pitch p that is smaller than the irradiation radius (r/2) or below.

Figure 1C:
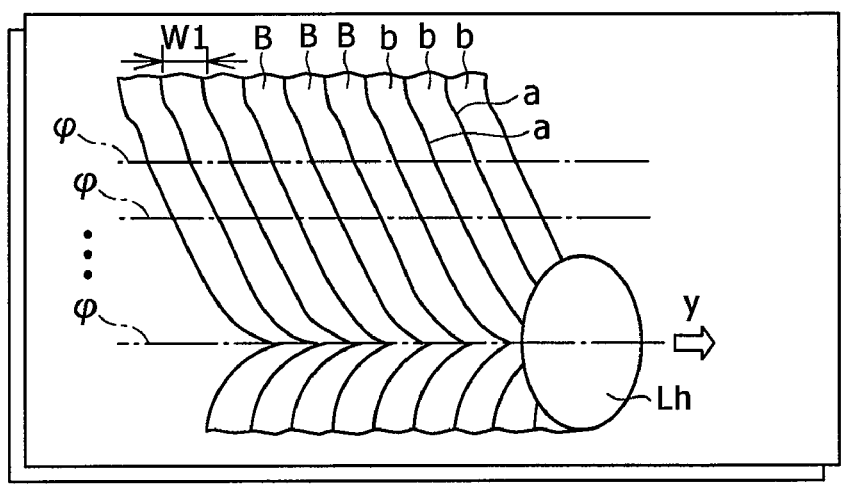

Subsequently, as shown in FIG. 1C, while shifting the scanning path by given pitches p, a third and subsequent scannings of the laser beam Lh are carried out at the respective shifted positions. In this way, crystal grains B are further grown in a direction different from the scanning direction y of the laser beam Lh, thereby forming crystal grains b extended in the form of a band in a direction substantially vertical to the scanning direction y. The scannings of the laser beam Lh at the respective positions should be carried out under the same conditions as the first scanning, under which the width W1 of the band-shaped crystal grains b in the scanning direction y are kept constant. Such band-shaped crystal grains b are aligned in the scanning direction to form a crystal region provided periodically with the crystal boundaries a at the width W1.

The width W1 of the band-shaped crystal grains b (i.e. a pitch of grain boundaries a) is a factor important for defining the number of grain boundaries a provided at a channel portion of a thin film semiconductor described hereinafter. As will be set forth in detail, the number (periodic number) of the grain boundaries a provided at the channel portion of the thin film semiconductor device should preferably be set at a greater number sufficient to uniformize a variation of transistor characteristics within a range where a carrier mobility is held. The width W1 of the crystal grains b is set herein at several hundreds of nanometers in conformity with the design of a thin film semiconductor device so that a greater number of grain boundaries a are provided at the channel portion within a range not impeding the tact time of the process.

More particularly, as described in the following examples, the width W1 of the band-shaped crystal grains b is set according to the channel length in such a way that about 50 grain boundaries a extending along the channel width are disposed at the channel portion.

In such a crystallization step as set out above, it is desirable that the characteristics of the grain boundaries a formed by irradiation of the laser beam Lh be made constant. For a factor of making constant characteristics of the grain boundaries a, it is necessary to keep constant an irradiation energy density of a laser beam at individual irradiation positions, keep the scanning speed constant, keep the pitch p of the laser beams Lh constant, and make the thickness of the semiconductor thin film 3 constant and the like.

In order to make the irradiation energy density of laser beam Lh constant, it is desirable that the laser beam Lh is in a continuously oscillated condition during the course of irradiation of the laser beam Lh at least on an active region. The term "continuously oscillated" used herein may include a case where there is a pause within a range where the temperature of the semiconductor thin film 3 does not lower (e.g. a pause of 50 ns or below). For carrying out such irradiation as set forth above while keeping the irradiation energy density of the laser beam Lh constant, it is desirable to use a laser beam irradiator equipped with an energy feed back function or focus servo function. The feed back function or focus servo function of energy may be set up by known techniques employed in cutting machines for optical disks.

The irradiation of the laser beam Lh on the semiconductor thin film 3 is set within a range where the scanning speed of the laser beam irradiation is kept constant.

The irradiation position of the laser beam Lh against the semiconductor thin film 3 may be moved relatively. More particularly, the substrate on which the semiconductor thin film has been formed may be moved relative to a fixed irradiation position of the laser beam, or the irradiation position of the laser beam may be moved relative to a fixed substrate. Alternatively, both the substrate 1 and the irradiation position of a laser beam may be moved, respectively.

The parallel scanning of the laser beam Lh in the crystallization step may be carried out successively by use of one laser oscillator, or may be carried out by use of a plurality of laser oscillators. Where fabrication of a thin film transistor for driving a display is taken into account, it is preferred to carry out the scanning on a plurality of active regions simultaneously. More particularly, it is preferred in view of productivity to use a method wherein laser beams Lh are subjected to multi-irradiation on a plurality of active regions set in alignment on the surface side of the substrate 1, so that the plurality of active regions are simultaneously crystallized.

In order to realize the multi-irradiation of the laser beams Lh, a semiconductor laser oscillator is appropriately used as an oscillation source for laser beam. Since the semiconductor laser oscillator is much smaller in size than other types of laser oscillators such as an excimer laser and a YAG laser, a plurality of such oscillators can be disposed in one apparatus and are able to generate a rated output power of 200 mW in continuous irradiation.

Using a semiconductor laser oscillator, a flexible device design is enabled for a substrate size by increasing the number of semiconductor lasers corresponding to a large-area substrate. In doing so, there can be obtained a structure wherein a great number of transistors having the same performance are arrayed on a large-sized substrate, with the advantage in the formation of transistors of a larger area having uniform characteristics when compared with a method of controlling grain boundaries by use of a mask as reported in study level.

The crystallization step having set out hereinabove may be carried out not only in an atmosphere of an inert gas, but also in air atmosphere. When the step is carried out in an air atmosphere, the apparatus is prevented from being large in size as a whole.

According to the crystallization step illustrated above, the band-shaped crystal grains b which extend in a substantially vertical direction different from the scanning direction y of the laser beam Lh are regularly aligned in the scanning direction y and polycrystallized. The width W1 in the scanning direction y of the respective crystal grains b can be conveniently controlled depending on the irradiation conditions such as the wavelength, scanning speed and irradiation energy of the laser beam Lh. Additionally, the crystal grains b are those obtained by completely melting the semiconductor thin film 3 by irradiation of the laser beam Lh and recrystallizing by liquid phase growth, and are thus good in crystal quality.

Accordingly, crystal grains having a good shape accuracy and a good quality are regularly aligned and thus, it becomes possible to form, in the semiconductor thin film, a polycrystalline region wherein a high carrier mobility is controlled in high accuracy.

<Manufacture of a Thin Film Semiconductor Device>

Next, a method for manufacturing a thin film semiconductor device carried out subsequently to such a crystallization method as set out hereinabove is illustrated. There is described herein a method for manufacturing a semiconductor device wherein a plurality of thin film transistors TFTs are formed on the same substrate 1. In the drawings, only one thin film transistor-forming portion is mainly depicted.

Figure 2A:
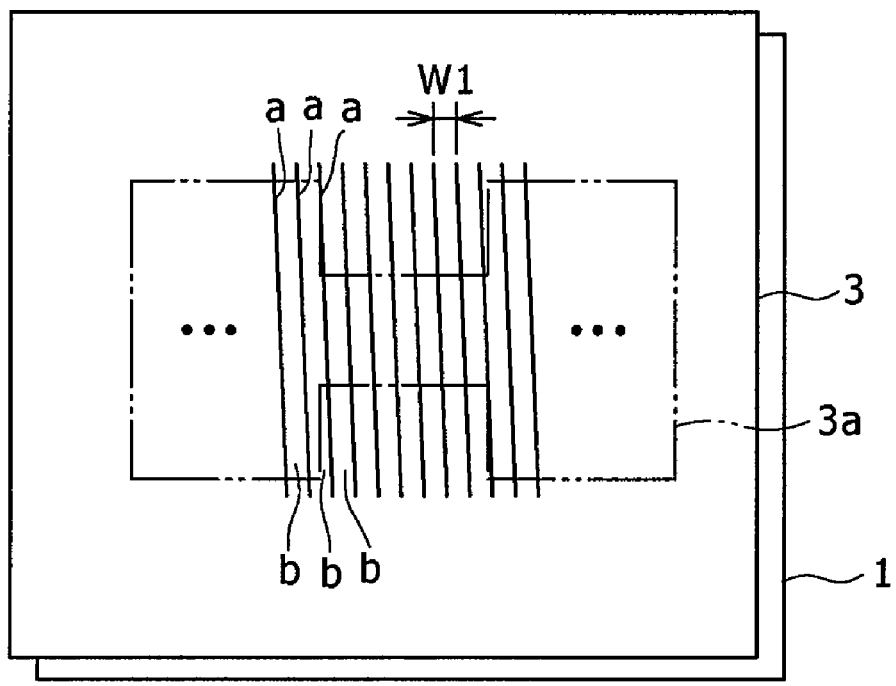
FIGS. 2A and 2B are, respectively, a plan view illustrating a method for manufacturing a thin film semiconductor device using the crystallization method of an embodiment of the invention.

Initially, as shown in FIG. 2A, individual active regions 3a set at the semiconductor thin film 3 on the substrate 1 are selectively crystallized on the entire surface thereof according to the crystallization method set out above. Band-shaped crystal grains b are formed within the respective active regions 3a across the active region 3a. In this way, grain boundaries a that are periodically arrayed at a width W1 (of several hundreds of nanometers) are aligned across the active region 3a. The length of the band-shaped crystal grains b is at about several μm to several hundreds of μm in conformity with the standard of thin film semiconductor.

Figure 2B:
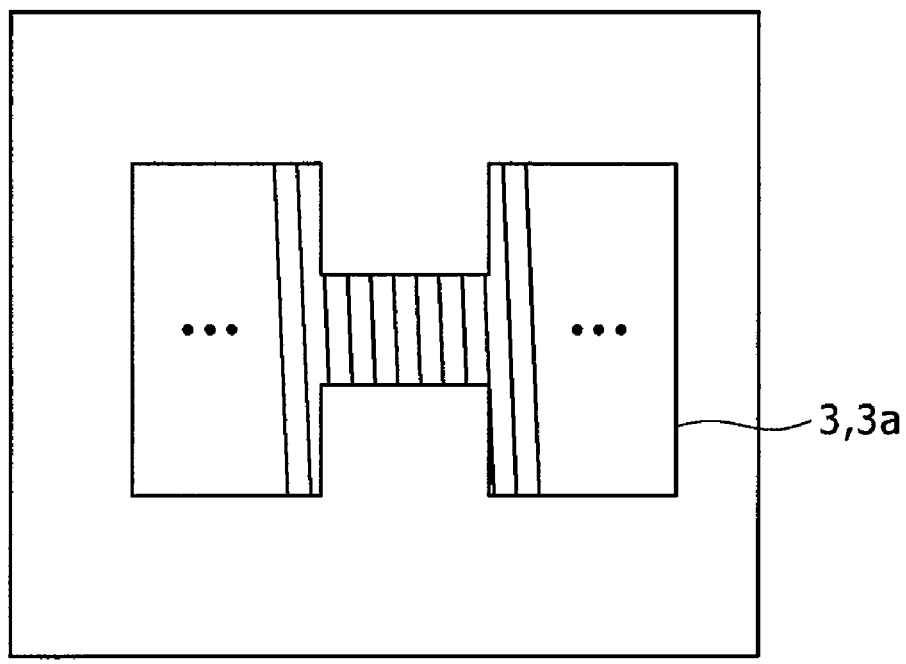

Next, as shown in FIG. 2B, the semiconductor thin film 3 is pattern etched in a given form so as to leave the crystallized active regions 3a, and the respective active regions 3a are divided as islands of a given form for element isolation. In this case, as shown in the figure, the semiconductor thin film 3 may be pattern etched is such a way that non-crystallized portions of the semiconductor thin film 3 are not left around the active region 3a. Alternatively, the semiconductor thin film 3 may be so pattern etched as to leave non-crystallized portions of the semiconductor thin film 3 around the active region 3a. In this case, the entirety of the crystallized region within an island-patterned region becomes an active region, and an amorphous region left therearound becomes an isolation region. It will be noted that such pattern etching of the semiconductor thin film 3 may be effected prior to the crystallization step. In this case, the respective semiconductor thin films 3 which have been patterned in the form of an island including a region serving as an active region 3a are subjected to such a crystallization step as stated before.

Next, a gate insulating film (not shown) is formed on the substrate 1 so as to cover the patterned active region 3a therewith. This gate insulating film may be made of silicon oxide or silicon nitride and can be formed by a known technique such as ordinary PE-CVD. Besides, known SOG or the like may be formed as a coated insulating film. It will be noted that the formation of the gate insulating film may be made prior to the pattern etching of the semiconductor thin film 3.

Figure 3:
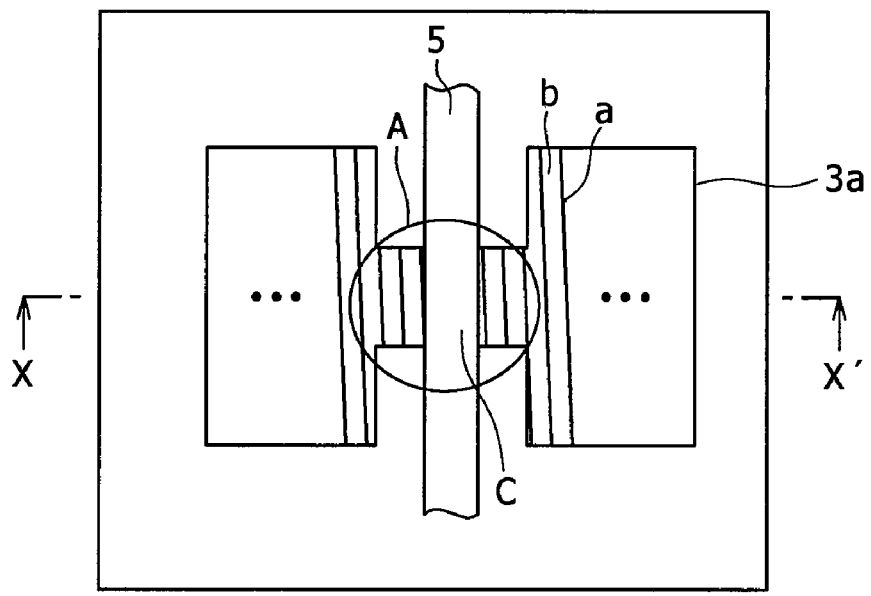
FIG. 3 is a view similar to FIG. 2 and is a plan view illustrating the method for manufacturing a thin film semiconductor device using the crystallization method an embodiment.
Figure 4:
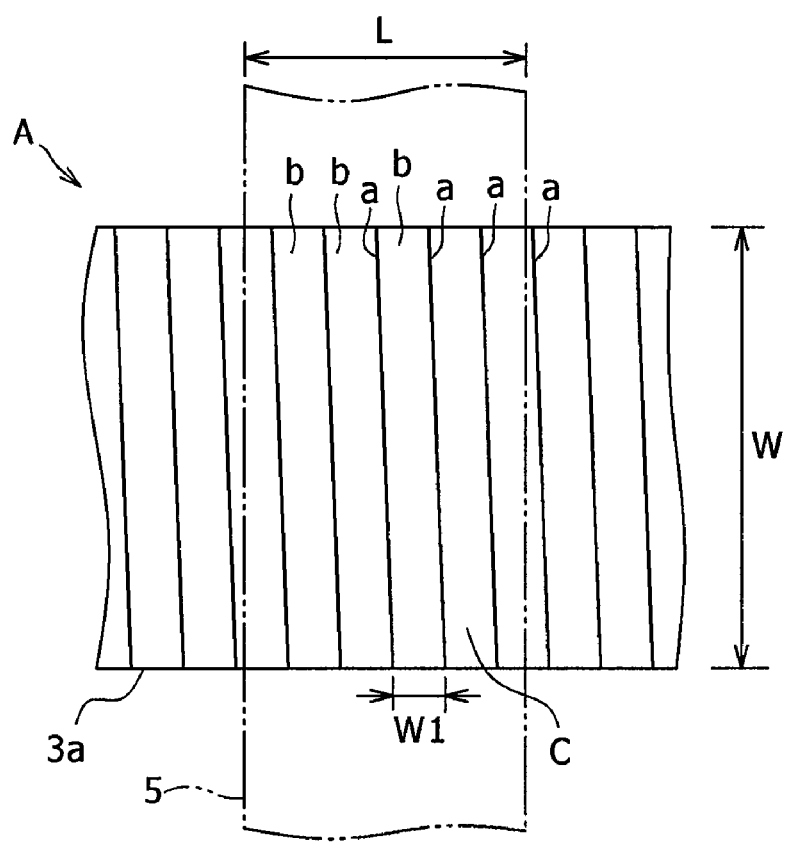
FIG. 4 is an enlarged plan view of portion A in FIG. 3.

Next, as shown in FIG. 3, a gate electrode 5 that are shaped as passing transversely across the central portion of the respective active regions 3a, each divided as an island, is formed over the gate insulating film. It is important that the gate electrode 5 be formed along a direction of extension of the grain boundaries a (along a direction of extension of the band-shaped crystal grains b). An enlarged view of portion A in FIG. 3 is shown in FIG. 4.

As shown in these figures, the gate electrode 5 is provided across a portion that is designed to have a given width W in the active region 3a, and the width of the active region 3a at a portion thereof which is crossed with the gate electrode 5 becomes a channel width W. In other words, a channel portion C below the gate electrode 5 is provided across the direction of the channel width W.

It is assumed that the line width (corresponding to a channel length L) of the gate electrode 5 is designed based on the standard of the thin film transistor formed herein and that a given number of grain boundaries a are arranged therebelow across the channel portion C in the direction of the channel width W. So far as thin film transistors having the same characteristics are concerned, it is important that substantially the same number of grain boundaries a be provided at the channel portion C. In the practice of the embodiment, the "substantially the same number" should preferably be within a range of a given number ±1.

If the number of grain boundaries a provided at the channel portion C is smaller in variation with respect to the ratio of the actual number of the boundaries to the given number thereof, the characteristic variation of the thin film transistor can be uniformized. In this sense, a greater number of grain boundaries a provided at the channel portion C is better on the condition that the number is two or over. More particularly, as will be described in examples appearing hereinafter, it is preferred that the width W1 of the crystal grains b (i.e. a pitch of grain boundaries) is so set in conformity with the channel L that about 25 grain boundaries a extending in the direction of the channel width W are provided at the channel portion C. It is to be noted here that a greater number of grain boundaries a across the direction of the channel length L at the channel portion C results in a lower carrier mobility along the direction of the channel length L. Thus, a greater number of grain boundaries a is better within a range where the carrier mobility is kept high to an extent.

Figure 5:
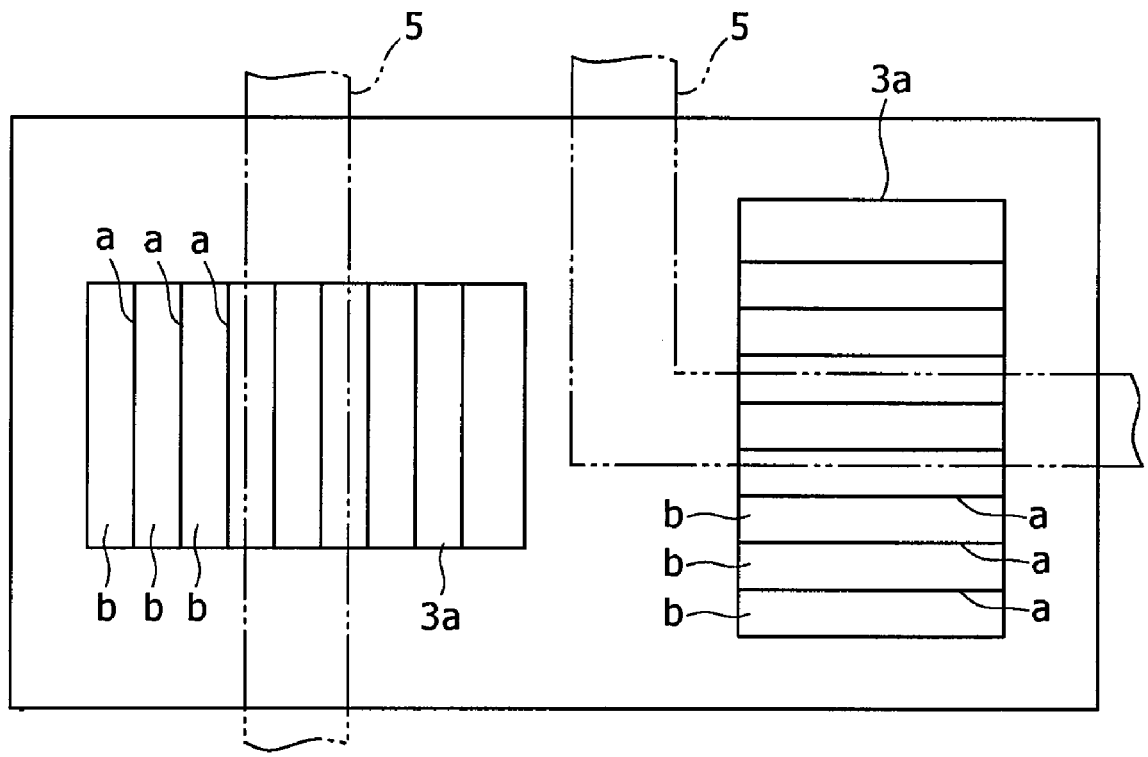
FIG. 5 is a plan view illustrating crystallization of a plurality of active regions.

As stated hereinabove, it is important to form the gate electrode 5 in a given state relative to the grain boundaries a provided at the respective active regions 3a. In the crystallization step, as shown in FIG. 5, the scanning direction of the laser beam Lh in individual active regions 3a is set in conformity with a direction of wiring of the gate electrode 5 to coincide the direction of extension of the grain boundaries a with the direction of wiring of the gate electrode 5 as shown in FIG. 5.

For the formation of the gate electrode 5 as stated above, a layer of an electrode material including, for example, of aluminium is formed by a sputtering or vacuum deposition method, followed by formation of a resist pattern on the electrode material layer by lithography. Thereafter, the electrode material layer is etched by use of the resist pattern mask to form a pattern for the gate electrode 5.

The formation of the gate electrode 5 is not limited to such a procedure as set out above. For instance, fine particles of a metal may be coated by a printing technique. In the etching of the electrode material layer upon formation of the gate electrode 5, the gate insulating film may be subsequently etched.

Figure 6:
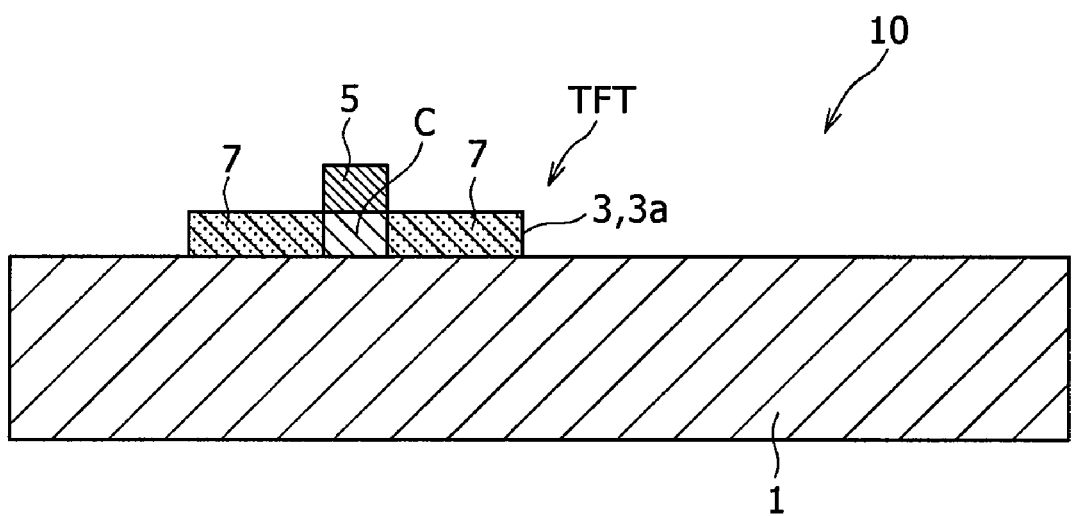
FIG. 6 is a sectional view taken along line X-X' in FIG. 3.

Next, as shown in the sectional view of FIG. 6, a source/drain 7 wherein an impurity is self-alignedly introduced into the active region 3a is formed by ion implantation using the gate electrode 5 as a mask and a subsequent annealing treatment. FIG. 6 corresponds to a section taken along line X-X' in FIG. 3.

In this way, there is formed a channel portion C including an impurity-free portion in the active region 3a that has been crystallized below the gate electrode 5. These source/drain 7 and the channel portion C below gate electrode 5 is constituted of the polysilicon obtained by crystallization of the semiconductor thin film 3, so that there can be obtained a thin semiconductor device 10 in which a plurality of top gate thin film transistors TFTs (i.e. polysilicon TFTs) using the polysilicon thin film are disposed on the same substrate 1.

Where, for example, a liquid crystal display is fabricated as a display wherein such a thin film transistor TFT is used as a switching element, the following steps are further carried out.

Figure 7A:
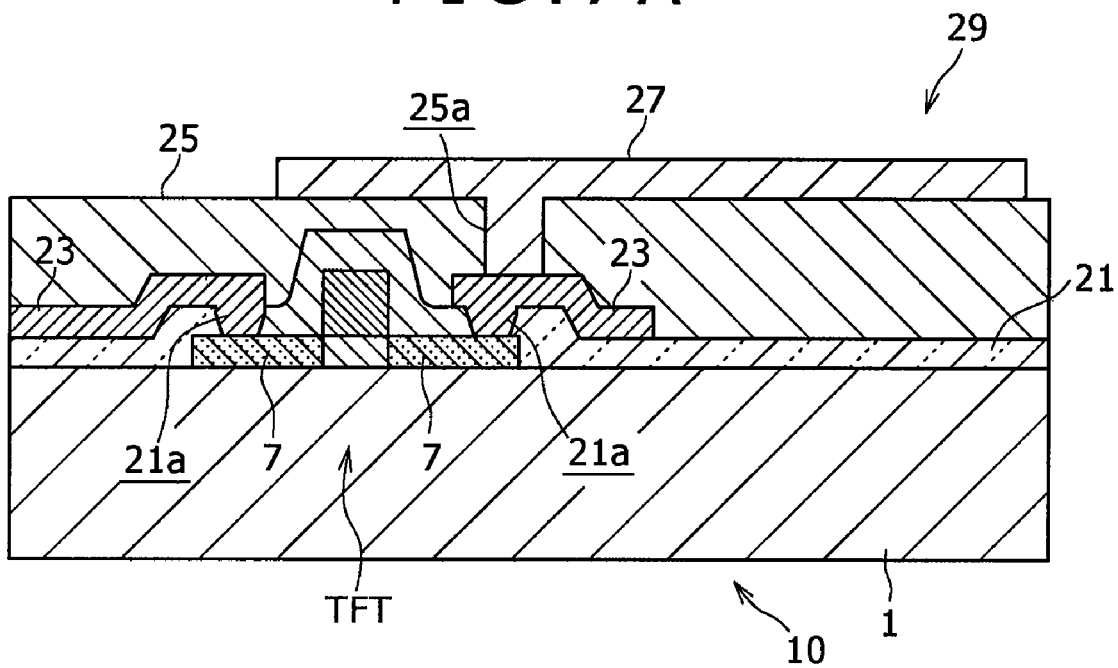
FIGS. 7A and 7B are, respectively, a schematic view showing a step of manufacturing a liquid crystal display using a thin film semiconductor device.

Initially, as shown in FIG. 7A, an interlayer insulating film 21 is formed over the substrate 1 of the thin film semiconductor device 10 so as to cover the thin film transistor TFT therewith. Next, a connection hole 21 arriving at the source/drain 7 of the thin film transistor TFT is formed in the interlayer insulating film 21. A wiring 23 connecting to the source/drain 7 via the connection hole 21a is formed on the interlayer insulating film 21.

A flattened insulating film 25 is formed to cover the wiring 23 therewith, and a connection hole 25a arriving at the wiring 23 is formed in the flattened insulating film 25. Thereafter, a pixel electrode 27 connected to the source/drain 7 via the connection hole 25a and the wiring 23 is formed on the flattened insulating film 25. The pixel electrode 27 is formed as a transparent electrode or a reflection electrode depending on the display type of liquid crystal display. The figure is a section of an essential part of one pixel.

Although not shown in the figure, an orientation film covering the pixel electrode 27 is formed on the flattened insulating film to complete a drive substrate 29.

Figure 7B:
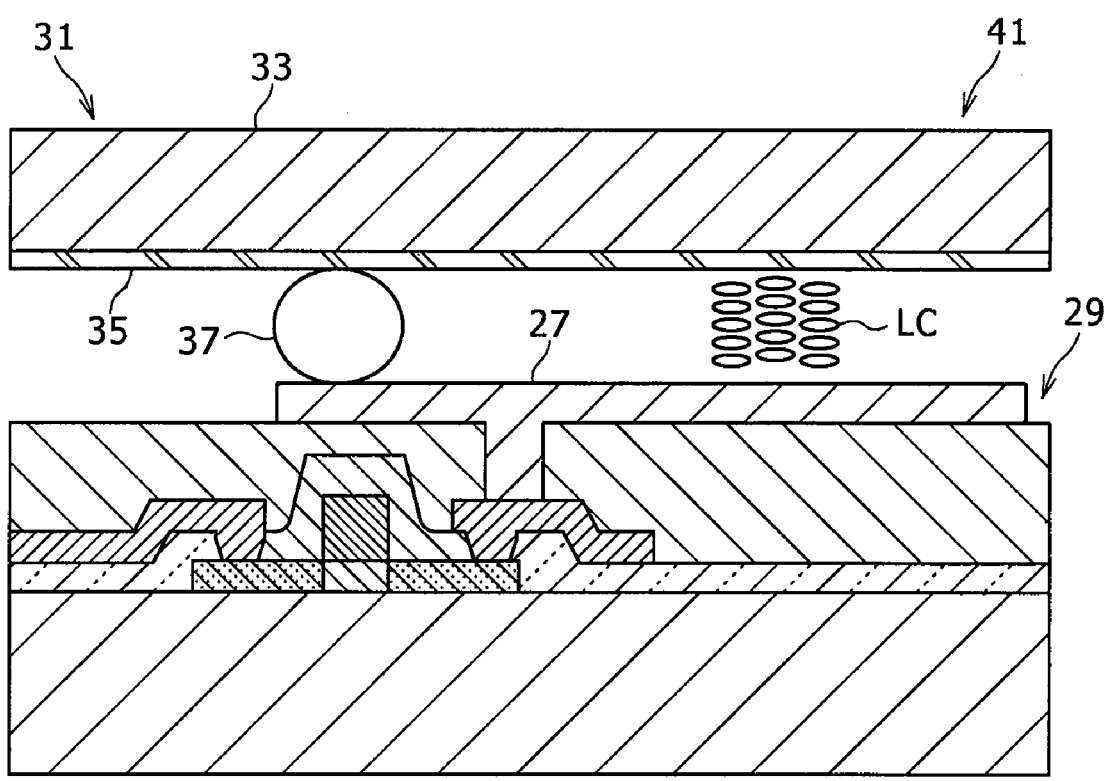

On the other hand, as shown n FIG. 7B, a counter substrate 31 to be disposed in face-to-face relation with the drive substrate 29 is provided. The counter electrode 31 is provided thereon with a common electrode 35 formed on a transparent substrate 33, and the common electrode 35 is covered with an orientation film not shown. The common electrode 35 is made of a transparent electrode.

The drive substrate 29 and the counter substrate 31 are arranged in face-to-face relation through a spacer 37 in such a way that the pixel electrode 27 and a common electrode 35 are facing each other. A liquid crystal phase LC is sealedly packed between the substrates 29 and 31 kept at a given space by means of the spacer 37 to complete a liquid crystal display 41.

Where an organic EL display is fabricated using the drive substrate 29 having such an arrangement as set out above, the pixel electrode disposed on the drive substrate 29 is provided as an anode (or a cathode), on which organic layers having necessary functions such as a hole injection layer, an emission layer and an electron transport layer are successively formed, followed by further formation, on the organic layers, of a common electrode serving as a cathode (or an anode).

The thin film semiconductor device 10 obtained by use of the crystallization method according to this embodiment is arranged such that, referring to FIGS. 3 and 4, the grain boundaries a extending along the gate electrode 5 pass across the channel portion C and are aligned in the direction of the channel length L on a periodic basis, under which carriers passing the channel portion C invariably move across the grain boundaries a located at a given width W1. The control of this width (i.e. the width W1 of the band-shaped crystal grains b) enables the thin film transistors TFT in the thin film semiconductor device 1 to be well controlled in accuracy with respect to the transistor characteristics (carrier mobility). That is, variation of carrier mobility in a plurality of elements is suppressed by uniformizing the width W1 of the band-shaped crystal grains b or the number of the band-shaped crystal grains b aligned in the channel portion C (i.e. the number of grain boundaries a).

The crystal state between the grain boundaries a-a is one constituted of the same crystal grains b. Eventually, no amorphous region is contained, and element characteristics are suppressed from degradation. The carrier mobility along the channel length L is kept high.

Accordingly, when the thin film transistors TFTs formed in the thin film semiconductor device are used as a switching element for pixel to constitute a display, the resulting display unit can be prevented from uneven brightness and color shading.

In the above embodiment, there has been illustrated the method of manufacturing a thin film semiconductor device provided with thin film transistors by application of the polycrystallization method according to the embodiment. However, the polycrystallization method is not limited to application to the manufacturing method of a thin film transistor, but is applicable to manufacturing methods of other types of electronic elements. In every case, an electronic element having good characteristic accuracy can be obtained by setting passage of a current across the grain boundary a.

The materials, starting materials, processes and numerical values indicated in the above embodiments are illustrated only by way of example. If necessary, other types of materials and starting material, processes and numerical values different therefrom may also be used.

EXAMPLES

Examples are illustrated and based on FIG. 1.

Example 1

Initially, a 120 nm thick silicon oxide film was formed on a quartz glass substrate according to a plasma CVD method to provide a substrate 1. A 50 nm thick semiconductor thin film made of amorphous silicon was formed on the substrate 1 by a plasma CVD method. Next, in order to eliminate an excess hydrogen ion from the semiconductor thin film 3, annealing treatment (dehydrogenation annealing treatment) was carried out in vacuum at 500° C. for one hour.

Thereafter, a GaN spot beam Lh having a diameter r of about 500 nm, an irradiation energy on the substrate surface of 12 mW and an effective NA of an objective lens of 0.8 was irradiated on the semiconductor thin film 3 while scanning in parallel to a given scanning direction y. In Example 1, the laser beam Lh was irradiated at pitches p of 100 nm while scanning in parallel to the scanning direction y at a scanning speed v of 1 m/second. It will be noted that irradiation of the laser beam Lh on the semiconductor thin film 3 was invariably controlled by means of a focusing servo so as not to miss the focus upon scanning. In order to make the irradiation energy constant, part of the irradiation energy was monitored to undergo no variation in energy.

When a region crystallized by irradiation with the laser beam Lh was observed through a scanning electron microscope (SEM), it was confirmed that there was obtained a crystalline region wherein band-shaped crystal grains b extending substantially in a direction vertical to the scanning direction y were regularly aligned. The width W1 of these band-shaped crystal grains b was found to be at about 400 nm.

Example 2

The general procedure of Example 1 was repeated except that the irradiation conditions of the laser beam Lh in Example 1 were changed to those including an effective NA of the objective lens of 0.4, a pitch p of 200 nm and a scanning speed v of 3 m/second along the scanning direction y.

The region crystallized by the irradiation with the laser beam Lh was observed by a scanning electron microscope (SEM), revealing that there was obtained a crystalline region wherein band-shaped crystal grains b extending substantially in a direction vertical to the scanning direction y were regularly aligned. The width W1 of these band-shaped crystal grains b was found to be at about 200 nm.

Examples 3-1, 3-2

Using the region polycrystallized in Example 1, thin film transistors having channel lengths (gate line widths) L of 10 µm and 20 µm and a channel width W of 50 µm were made as shown in Table 1 below. In the thin film transistors of Example 3, a gate wiring 5 was provided in parallel to the grain boundary a as shown in FIG. 3. The numbers of crystal boundaries a at the channel portion of the respective thin film transistors of Examples 3-1, 3-2 were at about 25 and about 50, respectively.

TABLE 1

|  | Channel length L | Channel width W | Number of grain boundaries a (periodic number) | Mobility (cm$^2$/Vs) | Vth variation |
| --- | --- | --- | --- | --- | --- |
| Example 3-1 | 10 µm | 50 µm | 25 | 120 | 0.29 V |
| Example 3-2 | 20 µm |  | 50 | 155 | 0.18 V |

GaN laser; NA=0.8, width W1 of crystal grain b=400 nm

The carrier mobility of these thin film transistors was measured. The results are shown in Table 1 above. As will be seen from Table 1, with the transistor whose channel length was at 10 □m, the carrier mobility was 120 cm$^2$/Vs and with the transistor whose channel length was at 20 □m, the carrier mobility was 155 cm$^2$/Vs. Ten thin film transistors were fabricated in each example and subjected to measurement of a variation in threshold value Vth. The respective thin film transistors were adjacently provided at pitches of 480 □m. From the results, it was confirmed that a greater number of grain boundaries a resulted in a smaller variation σ in threshold value Vth between the transistors and thus, thin film transistors of good characteristic accuracy could be obtained. Especially, it was confirmed that when the number of grain boundaries a was not smaller than 50, the variation □ in the threshold value Vth was suppressed to within 0.2 V, thus being very useful as a switching element having high mobility and disposed at a peripheral circuit region.

Examples 4-1, 4-2

Using a region polycrystallized in the same manner as in Example 2, thin film transistors having a channel length L (gate line width) of 10 µm or 20 µm and a channel width W of 50 µm were fabricated as shown in Table 2 below. Like Example 3, these thin film transistors of Example 4 were so arranged that a gate wiring 5 was provided in parallel to the grain boundaries a as shown in FIG. 3. The numbers of the grain boundaries a at channel portions in the thin film transistors of Examples 4-1 and 4-2 were at about 50 and about 100, respectively. In order to suppress an improvement or a variation in on-off characteristic, an alteration was added to the process in Example 4.

TABLE 2

|  | Channel length L | Channel width W | Number of grain boundaries a (periodic number) | Mobility (cm$^2$/Vs) | Vth variation |
|---|---|---|---|---|---|
| Example 4-1 | 10 μm | 50 μm | 50 | 200 | 0.10 V |
| Example 4-2 | 20 μm |  | 100 | 210 | 0.09 V |

GaN laser; NA=0.4, width W1 of crystal grain b=200 nm (with an improvement in process)

The carrier mobility of the thus fabricated thin film transistors was measured. The results are also shown in Table 2 above. As shown in Table 2, with the transistor whose channel length L was at 10 μm, the carrier mobility was at 200 cm$^2$/Vs and with the transistor whose channel length L was at 20 μm, the carrier mobility was at 210 cm$^2$/Vs. 30 thin film transistors were fabricated in each example were subjected to measurement of a variation in threshold value Vth. The respective transistors were adjacently provided at pitches of 480 μm. From the results, it was confirmed that like Example 3 (NA=0.8), a greater number of grain boundaries a resulted in a smaller variation a in threshold value Vth between the transistors and thus, the thin film transistors of good characteristic accuracy could be obtained. Especially, it was confirmed that even though the number of grain boundaries a was at about 50, the variation in the threshold value Vth could be suppressed to within 0.2 V, thus being very useful as a switching element having high mobility and disposed at a peripheral circuit region.

Comparative Example

A plurality of thin film transistors were made by application of a crystallization procedure using an excimer laser arranged in the past.

Initially, after formation of the semiconductor thin film 3 in the same as in Example 1, a KrF excimer laser was optically processed into a line beam having a width of 400 μm along a minor axis and a length of 100 mm along a major axis, and the laser beam was irradiated in such a way that the irradiation position was shifted by pitches of 8 μm along the minor axis in every pulse, while the beams were overlapped on the other regions. At this stage, the energy profile evaluated with respect to a section parallel to the minor axis was controlled to provide a top hat form (i.e. a trapezoidal form). Where irradiation was carried out under such conditions as indicated above, about 50 shots of pulse laser were irradiated on the same region. The irradiation laser was controlled by an attenuator to ensure 25 ns and an energy density corresponding to 310 mJ/cm$^2$ in one pulse.

The region that had been crystallized by irradiation of such a laser beam Lh was observed through a scanning electron microscope (SEM), revealing that a polycrystalline region was obtained wherein square-shaped crystals having an about 250 nm side length were aligned regularly in a lattice form.

Using the polycrystallized region, a thin film transistor having a channel length (gate line width) L of 20 μm was fabricated as shown in Table 3. The channel width W of the thin film transistor was set at 50 μm.

TABLE 3

|  | Irradiation energy beam | Mobility (cm$^2$/Vs) | Vth variation |
|---|---|---|---|
| Example 3-2 | GaN laser; NA = 0.8 | 155 | 0.18 V |
| Example 4-2 | GaN laser; NA = 0.4 | 210 | 0.09 V |
| Comparative Example | Excimer laser | 155 | 0.31 V |

Channel length L=20 μm, channel width W=50 μm (the process altered for NA=0.4)

The variation in Vth of the respective thin films was measured. The results are also shown in Table 3. In Table 3, the results of Examples 3-2 and 4-2 are also shown using the same standards as in Comparative Example (i.e. channel length L=20 μm and channel width W=50 μm).

From these results, it was confirmed that while the thin film transistors of Examples 3-2 and 4-2 using the semiconductor thin film crystallized by application of the embodiments were, with respect to the carrier mobility, equal to or better than the thin film transistor of the comparative example using the semiconductor thin film crystallized by means of the excimer laser without application of the embodiments, the variation in threshold value Vth could be suppressed.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method for crystallizing a semiconductor thin film by continuously irradiating an energy beam on the semiconductor thin film while scanning at a given speed and in a given scanning direction,
   wherein said energy beam is scanned in parallel lines in the same given scanning direction while keeping pitches of not larger than an irradiation diameter of said energy beam to grow band-shaped crystal grains in an oblique direction relative to the given scanning direction of said energy beam, and
   wherein the pitch for scanning the energy beam is set so that edge portions of crystal grains formed in a prior scan are melted again in a subsequent scan, and crystal grains in the subsequent scan take over the crystallinity of the crystal grains in the prior scan so as to further elongate the band shaped crystal grains in the oblique direction.

2. The method according to claim 1, wherein the pitch for scanning said energy beam in parallel lines is not larger than the irradiation radius of said energy beam.

3. The method according to claim 1, wherein scanning lines of said energy beam are in the same direction.

4. The method according to claim 1, wherein the pitch is made constant and said energy beam is scanned in parallel lines.

5. The method according to claim 1, wherein said semiconductor thin film is completely melted by the continuous irradiation of said laser beam.

6. The method according to claim 1, wherein said energy beam is used as a spot beam.

7. The method according to claim 1, wherein said energy beam includes a laser beam oscillated from a semiconductor laser oscillator.

* * * * *